United States Patent
Arnold et al.

(10) Patent No.: US 7,331,005 B2
(45) Date of Patent: Feb. 12, 2008

(54) SEMICONDUCTOR CIRCUIT DEVICE AND A SYSTEM FOR TESTING A SEMICONDUCTOR APPARATUS

(75) Inventors: Ralf Arnold, Poing (DE); Gerd Frankowsky, Hoehenkirchen-Siegertsbrunn (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 356 days.

(21) Appl. No.: 11/189,231

(22) Filed: Jul. 26, 2005

(65) Prior Publication Data

US 2006/0026475 A1  Feb. 2, 2006

(30) Foreign Application Priority Data

Jul. 26, 2004 (DE) .................. 10 2004 036 145

(51) Int. Cl.
*G01R 31/28* (2006.01)
*G06K 5/04* (2006.01)
*G06F 11/00* (2006.01)

(52) U.S. Cl. .................. 714/731; 714/700; 713/503
(58) Field of Classification Search ............... None
See application file for complete search history.

(56) References Cited

U.S. PATENT DOCUMENTS

| | | | |
|---|---|---|---|
| 5,461,273 A * | 10/1995 | Kawasaki et al. | 310/316.02 |
| 6,556,492 B2 | 4/2003 | Ernst et al. | |
| 6,646,937 B2 | 11/2003 | Pöchmüller | |
| 6,721,904 B2 | 4/2004 | Ernst et al. | |
| 6,839,397 B2 | 1/2005 | Ernst et al. | |
| 6,871,306 B2 | 3/2005 | Ernst et al. | |
| 7,221,723 B2 * | 5/2007 | Walker | 375/355 |
| 2003/0005389 A1 | 1/2003 | Ernst et al. | |
| 2003/0056148 A1 | 3/2003 | Kiehl et al. | |
| 2004/0054482 A1 * | 3/2004 | Poechmueller | 702/57 |

FOREIGN PATENT DOCUMENTS

| | | |
|---|---|---|
| DE | 100 34 850 A1 | 2/2002 |
| DE | 100 34 851 A1 | 2/2002 |
| DE | 100 34 852 A1 | 2/2002 |
| DE | 100 34 855 A1 | 2/2002 |
| DE | 100 61 243 A1 | 6/2002 |

(Continued)

OTHER PUBLICATIONS

German Patent Office Examination Report dated Feb. 14, 2005.

*Primary Examiner*—Phung My Chung
(74) *Attorney, Agent, or Firm*—Patterson & Sheridan, L.L.P.

(57) ABSTRACT

Methods and apparatus for testing a semiconductor device. A testing interface is configured to interface with an external test apparatus and a device under test (DUT). In one embodiment, the testing interface receives test data and a test clock signal from the external test apparatus. The test data is clocked out of the testing interface and to the DUT according to the test clock signal. Further, the test clock signal is delayed by a period of time and then a delayed clock signal is issued to the device. The data previously written to the DUT is read out of the DUT and compared with the test data received from the external test apparatus. The period of time by which the test clock signal is delayed can be varied to achieve a desired timing.

23 Claims, 5 Drawing Sheets

FOREIGN PATENT DOCUMENTS

| | | |
|---|---|---|
| DE | 100 34 899 C1 | 7/2002 |
| DE | 101 17 891 A1 | 10/2002 |
| DE | 101 22 619 C1 | 2/2003 |
| DE | 102 31 419 A1 | 2/2004 |
| DE | 101 45 745 B4 | 4/2004 |

* cited by examiner

SEMICONDUCTOR CIRCUIT DEVICE AND A SYSTEM FOR TESTING A SEMICONDUCTOR APPARATUS

CROSS-REFERENCE TO RELATED APPLICATIONS

This application claims foreign priority benefits under 35 U.S.C. §119 to co-pending German patent application No. DE 10 2004 036 145.2, filed 26 Jul. 2004. This related patent application is herein incorporated by reference in its entirety.

BACKGROUND OF THE INVENTION

1. Field of the Invention

The present invention relates to a semiconductor circuit device, and to a system for testing a semiconductor apparatus.

2. Description of the Related Art

It is known for semiconductor storage apparatuses to be tested with the aid of test equipment.

When testing semiconductor storage apparatuses, the accuracy of the interface timing, inter alia, is also checked, and, in particular, the so-called setup time and hold time. However, in the case of high-frequency operation and testing of a semiconductor storage apparatus, for example using a clock frequency of more than 500 MHz, it becomes increasingly more difficult to check the accuracy of the interface timing, since test apparatuses must be used which can produce such high clock frequencies with high accuracy, and can also measure short times with high accuracy.

FIG. 6 illustrates one arrangement for testing a semiconductor storage apparatus. The semiconductor storage apparatus 1 to be tested is arranged on a test board 2. The test apparatus 3 is connected via lines 4 to the semiconductor storage apparatus 1 to be tested. As can be seen in the figure, a dedicated signal line is in each case required for signals which are sent from the test apparatus 3 to the semiconductor storage apparatus 1 (DQ and DQS) and for signals which are sent from the semiconductor storage apparatus 1 to the test apparatus 3 (DQ* and DQS*).

When using a test set for production of the test signals, a calibration process must be carried out owing to the physical distance between the test apparatus 3 and the semiconductor storage apparatus to be tested. Furthermore, the timing of the test apparatus is subject to stringent accuracy requirements owing to the propagation delay from the test apparatus to the semiconductor storage apparatus to be tested. Furthermore, it is necessary to provide a large number of appropriate, high-precision tester channels.

It is also known for a separate device, which is connected to the test set and to the semiconductor storage apparatus, to be provided in the vicinity of the semiconductor storage apparatus to be tested. An apparatus such as this is used in order to use signals which comply with the required accuracy for testing of the semiconductor storage apparatus.

One such device is known, for example, from DE 101 22 619 C1. In this case, a clock signal which is received from an external test set at a low frequency has its frequency multiplied by a specific factor in order to produce the working clock signal.

DE 100 34 899 C1 describes a semiconductor circuit module which has a time reference circuit. The time reference circuit comprises a delay locked loop circuit.

However, these apparatuses have the disadvantage that the design is very complex, and the production of the apparatuses is thus costly.

SUMMARY OF THE INVENTION

One object of the present invention is thus to provide a semiconductor circuit device and a system for testing semiconductor apparatuses, which allow simpler and lower-cost testing of semiconductor apparatuses, in particular at high clock frequencies.

According to the invention, a semiconductor circuit device or a semiconductor circuit module is provided for testing a semiconductor apparatus, preferably a semiconductor storage apparatus or a memory chip, comprising:

at least one test data production device for production of a test data signal;

at least one test clock input which can be connected for signalling purposes to the external test apparatus, for reception of a test clock signal which is produced by the external test apparatus, with at least one test data signal being associated with a test clock signal;

at least one first adjustable write delay device or input delay device for adjusting, changing or fine tuning the relative time relationship between the test data signal that is produced and the received test clock signal;

at least one test data output, which can be, or is, connected for signalling purposes to the semiconductor apparatus to be tested, for emitting a test data signal to the semiconductor apparatus;

at least one test data clock output, which can be, or is, connected for signalling purposes to the semiconductor apparatus to be tested, for emitting a test data clock signal to the semiconductor apparatus; wherein the test data production device and at least one test data output are connected to one another for signalling purposes;

one test clock input and at least one test data clock output are connected to one another for signalling purposes; and the first write delay device is provided in the signal path between the test data production device and the test data output, and/or in the signal path between the test clock input and the test data clock output.

The test signals received from the test apparatus are not significantly changed in the semiconductor circuit device. In fact, only the timing or relationship of the signals with respect to one another is changed. In particular, in this case, the time relationship of the signals, in particular the time relationship of a test data clock signal to a test data signal, can be set with the accuracy required for testing the interface timing. The test signals are thus regenerated locally in time in the semiconductor circuit device, with the original format of the signals being essentially retained. The logic relationship between the test signals remains substantially unchanged.

The provision of the first write delay device makes it possible to achieve the relative time relationship between a test data signal and the associated clock signal in a simple manner.

In particular, the received clock signal in the present semiconductor circuit device is emitted essentially unchanged, with the relative timing of this signal having been changed if required.

In one preferred embodiment, the test data production device has at least one test data input which can be connected to an external test apparatus for signalling purposes, for reception of a test data signal which is produced by the external test apparatus.

In this case, the test data signal is produced by the test apparatus and is supplied via the at least one test data input to the semiconductor circuit device. The received test data signals and test clock signals or test data clock signals are related to one another in time as required in the semiconductor circuit device, and are then emitted to the semiconductor apparatus to be tested.

In an alternative embodiment, the test data production device has:

a test pattern production device or storage device for production of at least one test pattern or data signal which is stored or programmed in the semiconductor circuit device;

a selection device for selection of a test pattern, wherein the selection device is designed in order to select the test pattern as a function of a test pattern selection signal.

The test pattern selection signal is preferably transmitted via at least one test pattern selection input. The test pattern selection input may in this case be a test data input.

The storage of at least one test pattern in the semiconductor circuit device also makes it possible to reduce the number of lines which are required in order to connect the semiconductor circuit device to the test apparatus. In particular, the number of lines which must then be provided for data signals need correspond only to the number of digits in the binary-coded total number of stored test patterns. If, for example, two test patterns are stored, the test pattern can be selected with the aid of a signal which is transmitted via one line. Furthermore, it is possible to provide for the selection signal for selection of the test pattern to be transmitted in serial form, so that only one transmission line is required.

The semiconductor circuit device furthermore preferably has:

at least one data input which can be, or is, connected for signalling purposes to the semiconductor apparatus to be tested, for receiving a data signal which is emitted from the semiconductor apparatus;

at least one data clock input, which can be, or is, connected for signalling purposes to the semiconductor apparatus to be tested, for receiving a data clock signal which is emitted from the semiconductor apparatus;

at least one input/output connection, which can be connected for signalling purposes to the test apparatus, at least for outputting a test result and/or a signal, which is emitted from the semiconductor apparatus, to the external test apparatus and/or for reception of programming commands.

In particular, it is possible to provide for the signal which is transmitted via the input/output connection to be so-called "slow" signals. These are signals which are transmitted at a lower rate from and to the test apparatus than the test signals which are transmitted from the test apparatus to the semiconductor circuit device.

The test clock input is preferably a test data clock input, and the received test clock signal is preferably a test data clock signal which essentially does not run continuously, or is interrupted at times.

A test data clock signal is, in particular, a clock signal which is used in order to allow data to be written to and read from a semiconductor apparatus. Essentially, this signal is provided when the aim is to read or write data. When no read or write command has been issued, this signal is not present nor applied.

Alternatively:
the received test clock signal is a clock signal which essentially runs continuously, is unformed, is free or essentially runs continuously; and
the semiconductor circuit device has at least one data clock activation input, which can be connected for signalling purposes to the test apparatus, for reception of a data clock activation signal for switching on a test data clock signal which is produced from the test clock signal and essentially does not run continuously.

The expression a clock signal which essentially runs continuously means, in particular, a clock signal which, although it has the same period as the data clock signal produced from it, has more edges or clock pulses than required for a data clock signal which essentially does not run continuously.

The signal to be transmitted to the semiconductor apparatus to be tested thus corresponds to the received test clock signal which runs continuously and was activated (enabled) with the aid of the data clock activation signal. The received test clock signal is transmitted as a test data clock signal to the semiconductor apparatus once it has been activated with the aid of the data clock activation signal.

Furthermore, it is possible to provide that:
the test clock input is connected to the first write delay device for signalling purposes;
the data clock activation input is connected for signalling purposes to an amplification device which is downstream from the first write delay device in the signal path; and
the amplification device is configured to output or not to output the delayed test clock signal to the semiconductor apparatus as a function of the received data clock activation signal.

In particular, the provision of the amplification device makes it possible to pass on, or to prevent the passing on, of the received test clock signal to the semiconductor apparatus. The emitted test data signal thus corresponds essentially in places to the test clock signal which is received in the semiconductor circuit device.

The semiconductor circuit device preferably also has:
at least one test clock output, which can be, or is, connected for signalling purposes to the semiconductor apparatus to be tested, for outputting a test clock signal to the semiconductor apparatus; and
at least one second adjustable write delay device or input delay device;
wherein the test clock input and the test clock output are connected for signalling purposes to one another via the second adjustable write delay device.

The second adjustable write delay device is intended in particular to delay the received test clock signal. The delayed test clock signal can be emitted subsequently to the semiconductor apparatus. Suitable adjustment of the first and second adjustable write delay devices makes it possible in particular to carry out a test on the semiconductor apparatus with respect to the delay between the clock signal and the data clock signal.

The semiconductor circuit device may also have at least one first flip-flop or multivibrator circuit, wherein
the test clock input is connected for signalling purposes to the clock input of the first flipflop; and
the test data production device is connected for signalling purposes to the test data output via the flip-flop.

The first flipflop is used to latch the test data signals to the received test clock signal, and can subsequently be transmitted to the semiconductor apparatus to be tested. The clock input of a flipflop is, in particular, that input via which the clock signal is supplied to the flipflop to which the signal that is applied to the flipflop is intended to be latched. In a corresponding manner, the signal input of a flipflop is that input to which the signal to be latched is applied.

The semiconductor circuit device also preferably has:
at least one second flipflop or multivibrator circuit; and at least one adjustable read delay device or output delay device for delaying the received data clock signal;

wherein the data clock input is connected for signalling purposes via the read delay device to the clock input of the second flipflop; and the data input is connected for signalling purposes to the signal input of the second flip-flop.

The second flipflop can be used to latch the data signals which have been read from the semiconductor apparatus to be tested during a test, and the data clock signals. In this case, the timing of the latched signals can be set with the aid of the read delay device.

The delay time which can be set in the read delay device is preferably within a predetermined range.

The semiconductor circuit device preferably also has a comparison device for comparison of the signal emitted from the second flipflop with a reference signal emitted from the first flipflop at a predetermined time, and for outputting the comparison result to the test apparatus via the input/output connection.

The provision of the comparison device in the semiconductor circuit device itself makes it possible to determine in the semiconductor circuit device whether the measurement result does or does not correspond to the required conditions. It may thus be sufficient to provide only one input/output connection, via which a binary signal is transmitted which indicates whether or not the predetermined conditions have been satisfied. The number of lines and connections required between the test apparatus and the semiconductor circuit device can thus be reduced further. In particular, a binary pass/fail signal can be transmitted to the test apparatus.

It is possible to provide for the delay device or devices to be adjustable with the aid of an adjusting signal which is transmitted via the input/output connection.

The first write delay device is preferably designed in order to produce a signal delay, and the signal delay that is produced can assume or assumes a value of the minimum setup time and the difference between the bit duration of one data bit and the minimum hold time of the semiconductor apparatus.

The setup time $t_S$ is in this case that time interval before a an edge of a data clock signal in which a data signal which is intended to be written or read with that edge must assume a predetermined value. The hold time $t_H$ is in this case that time interval after a edge of a data clock signal in which a data signal which is intended to be written or read with that edge must assume a predetermined value. The minimum setup time and the minimum hold time are in this case the minimum value or least value which the setup time and the hold time can assume.

Since the signal delay of the first write delay device can be varied within the above range, the setup time and the hold time of the semiconductor apparatus to be tested can be determined.

The setup time $t_S$ and the hold time $t_H$ assume very low values particularly during high-frequency operation of the semiconductor apparatus, for example at 500 MHz.

Furthermore, according to the invention, a system is provided for testing a semiconductor apparatus, preferably a semiconductor storage apparatus or a memory chip, comprising:

an external test apparatus for production of test signals;

at least one semiconductor circuit device according to the invention or a preferred embodiment thereof, which is physically associated with a semiconductor apparatus to be tested.

In particular, the semiconductor circuit device is provided in the vicinity of, at or on the semiconductor apparatus to be tested or on the same mount as the semiconductor apparatus to be tested.

The system preferably has a large number of semiconductor circuit devices and a distribution device for reception of test signals from the test apparatus and for passing on the test signals to the large number of semiconductor circuit devices.

The provision of the distribution device makes it possible to further reduce the number of lines and connections required between the test apparatus and the semiconductor circuit device. In particular, the signal which is transmitted from the test apparatus can be used for testing two or more semiconductor apparatuses.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
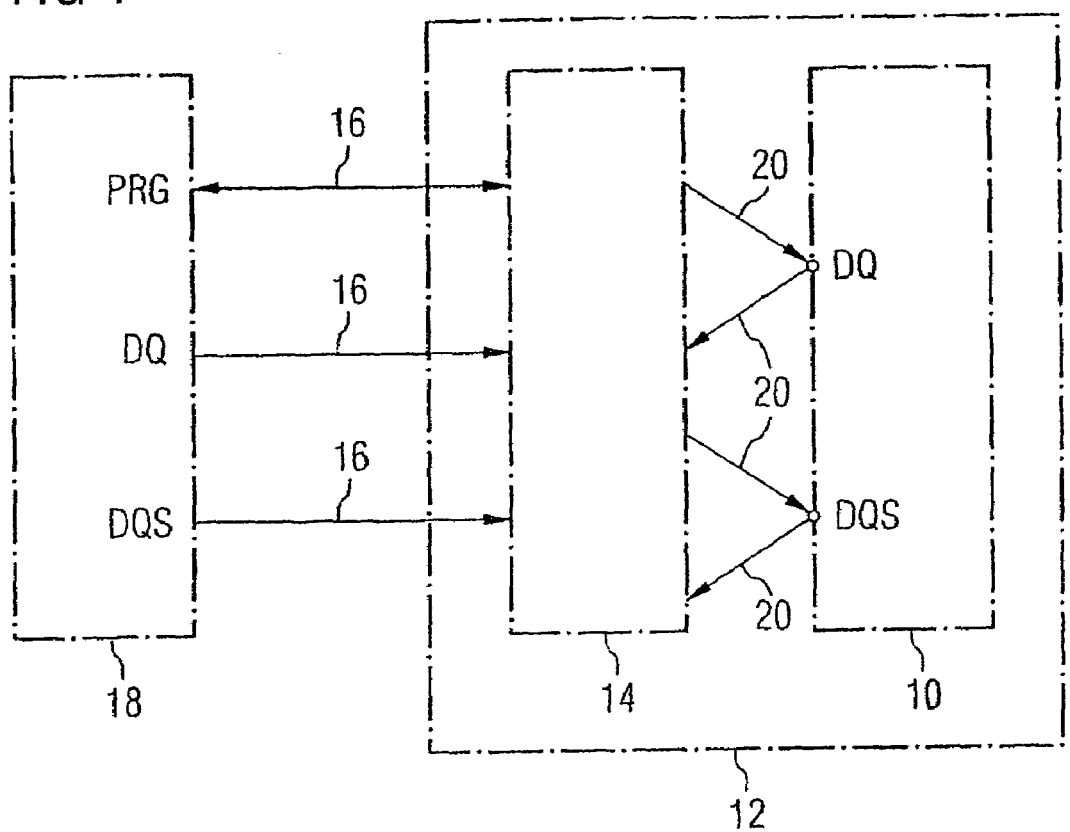
FIG. 1 shows a schematic view of a system for testing a semiconductor storage apparatus according to one preferred embodiment of the present invention.

First of all, the following text will describe the general configuration of a system for testing a semiconductor apparatus, in particular a semiconductor storage apparatus, according to one preferred embodiment of the present invention, and with reference to FIG. 1.

A semiconductor storage apparatus 10 to be tested is arranged on a test board or a test mount 12. A semiconductor circuit device 14 is provided in the physical vicinity of the semiconductor storage apparatus 10, and likewise on the test board 12. The semiconductor circuit device 14 is connected for signalling purposes via cables or lines 16 to an external test apparatus 18.

By way of example, the external test apparatus 18 may be a conventional test apparatus which is used for testing high-frequency semiconductor storage apparatuses. However, there is no need for the external test apparatus 18 to have sufficient accuracy for testing the interface timing of the semiconductor storage apparatus 10, as will be described in the following text.

The semiconductor circuit device 14 is connected for signalling purposes via connections 20 to the semiconductor storage apparatus 10. Furthermore, the semiconductor circuit device 14 is arranged in the vicinity of the semiconductor storage apparatus 10, so that the connections 20 are as short as possible. As described above, both the semiconductor storage apparatus 10 and the semiconductor circuit device 14 are arranged on the test board 12, for testing. However, as an alternative, it is also possible to provide for the semiconductor circuit device 14 to be a part of the semiconductor storage apparatus.

Figure 2:
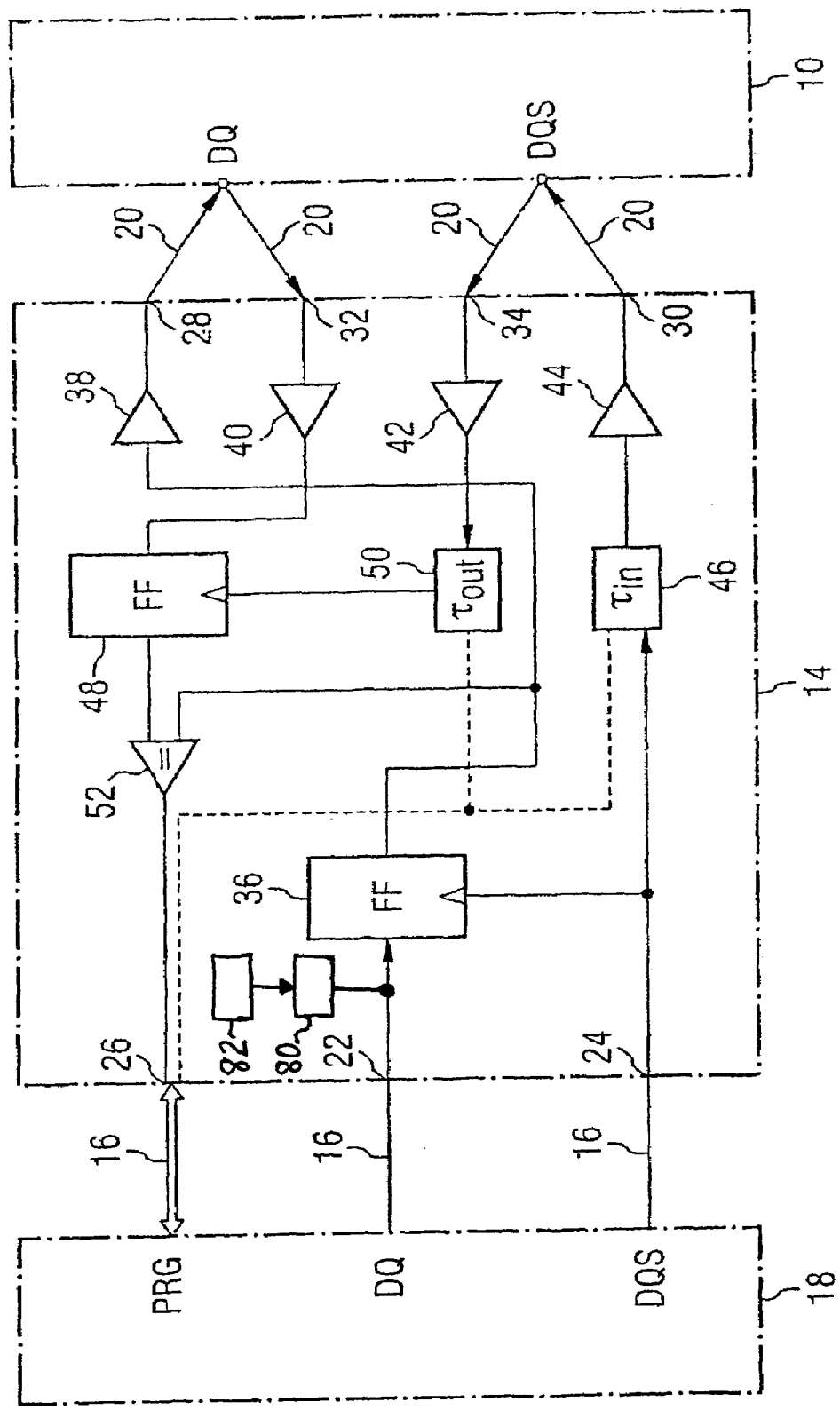
FIG. 2 shows a schematic view of a semiconductor circuit device according to a first preferred embodiment of the present invention.

A semiconductor circuit device 14 according to a first preferred embodiment of the present invention is illustrated in FIG. 2. FIG. 2 shows a schematic view of the semiconductor circuit device 14. In particular, FIG. 2 shows only a part of the semiconductor circuit device. The following description relates, by way of example, to an input 22 for a data signal DQ and to an input 24 for a clock signal DQS. However, it is also possible to provide for a large number of such inputs and outputs to be provided in the semiconductor circuit device 14.

The semiconductor circuit device 14 has a test data input 22 for reception of a test data signal DQ, which is produced by and transmitted from the test apparatus 18, and a test data clock input 24 for reception of a test data clock signal DQS which is produced by the test apparatus 18. Furthermore, the semiconductor circuit device 14 has an input/output connection 26, via which programming and selection commands can be transmitted from the test apparatus to the semiconductor circuit device 14, and test result data can be transmitted from the semiconductor circuit device 14 to the test apparatus 18. Furthermore, the semiconductor circuit device 14 has a test data output 28 for emitting a test data signal to the semiconductor storage apparatus 10, and has a test data clock output 30 for emitting a test data clock signal to the semiconductor storage apparatus 10. A data input 32 and a data clock input 34 are also provided in the semiconductor circuit device 14, for reception of a data signal or data clock signal which is transmitted or read from the semiconductor storage apparatus 10.

The test data input 22 is connected for signalling purposes via a flip-flop 36 and an amplification device 38 to the test data output 28. The test data clock input 24 is connected for signalling purposes to the clock input of the flipflop 36, so that the data signal DQ, which is transmitted via the test data input 22, is transferred or latched to the test data clock signal DQS, which is transmitted via the test data clock input 24, and is thus produced at the output of the flipflop 36.

The test data clock input 24 is also connected for signalling purposes to a first write delay device 46, in which the time delay of the signal $\tau_{in}$ can be adjusted. The write delay device 46 is also connected for signalling purposes via an amplification device 44 to the test data clock output 30.

The data input 32 is connected for signalling purposes via an amplification device 40 to a second flipflop 48. The data clock input 34 is connected for signalling purposes via an amplification device 42 and a read delay device 50 to the clock input of the flipflop 48. The read delay device 50 is designed such that the data clock signal which is received via the data clock input 34 is delayed by a delay time $\tau_{out}$, which can be adjusted. The data signal which is received via the data input 32 is thus latched by the flipflop 48 to the data clock signal delayed by $\tau_{out}$.

Furthermore, a comparison device (comparator) 52 is provided, whose first input is connected for signalling purposes to the output of the second flip-flop 48, and whose second input is connected for signalling purposes to the output of the first flipflop 36. It is also possible to provide for a further delay stage to be provided in the signal path between the flipflop 36 and the comparison device 52. The output of the comparison device 52 is connected for signalling purposes to the input/output connection 26.

The first input delay device 46 and the read delay device 50 can be adjusted, regulated or controlled with the aid of a signal which is transmitted via the input/output connection 26 from the test apparatus 18.

The operation of the semiconductor circuit device 14 as described above will be described in the following text with reference to FIGS. 2 and 3.

The test data signals DQ and test data clock signals DQS which are required for a test are generated in the test apparatus 18. In this case, the test signals which are produced by the test apparatus 18 are already at the data rate or frequency that is required for testing the semiconductor storage apparatus 10. However, particularly for testing the setup time $t_S$ and hold time $t_H$ of a semiconductor storage apparatus 10, it is also important to be able to set the timing of a test data signal and of the associated test data clock signal very accurately. In conventional external test apparatuses 18, this accurate setting of the time reference for the data signals and data clock signals with respect to one another frequently cannot be set with the necessary precision, particularly for high data rates. An external test apparatus 18 can be used for a system according to the present invention, which admittedly can produce signals at the required data rate, but does not satisfy the necessary requirements for the accuracy of the time setting of the data signals and data clock signals.

The test signals that are produced by the external test apparatus 18 are supplied via lines 16 to the semiconductor circuit device 14. The data signals DQ are latched to the data clock DQS with the aid of the flipflop 36, are amplified in the amplification device 38, and are supplied via the test data output 28 to the semiconductor storage apparatus 10. The test data clock signal DQS which is received via the test data clock input 24 is also delayed by the delay time in $\tau_{in}$, the adjustable delay device 46, is amplified in the amplification device 44 and is supplied via the test data clock output 30 to the semiconductor storage apparatus 10.

The adjustable delay device 46 can be used to determine whether the semiconductor storage apparatus 10 to be tested satisfies the necessary requirements relating to the setup time $t_S$ and hold time $t_H$. In particular, the delay can be set such that the edge of the data clock signal DQS is varied with respect to the data signal DQ to which the data signal is intended to be latched, thus checking the setup time $t_s$ and the hold time $t_H$. This is illustrated in FIG. 3. In particular, the rising or falling edge of DQS, with which a data signal DQ is transferred, can be varied over a predetermined range by suitable adjustment of the delay time $\tau_{in}$.

Figure 3:
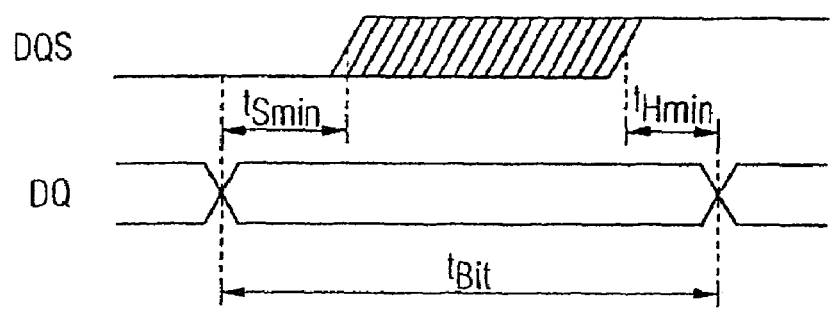
FIG. 3 shows a signal diagram, which shows the profile of input signals in the semiconductor circuit device shown in FIG. 2.

As illustrated in FIG. 3, the range within which the delay time $\tau_{in}$ can be adjusted extends between the minimum setup time $t_{Smin}$ and the difference between the bit duration of a data bit $t_{Bit}$ and the minimum hold time $t_{Hmin}$. The minimum setup time $t_{Smin}$ and the minimum hold time $t_{Hmin}$ are in this case the shortest value to be expected for the setup time $t_S$ and the hold time $t_H$.

The adjustable delay device 46 thus means that the rising or falling edge of the DQS signal can be moved in a predetermined time window (shown by the shaded area in FIG. 3).

Figure 4:
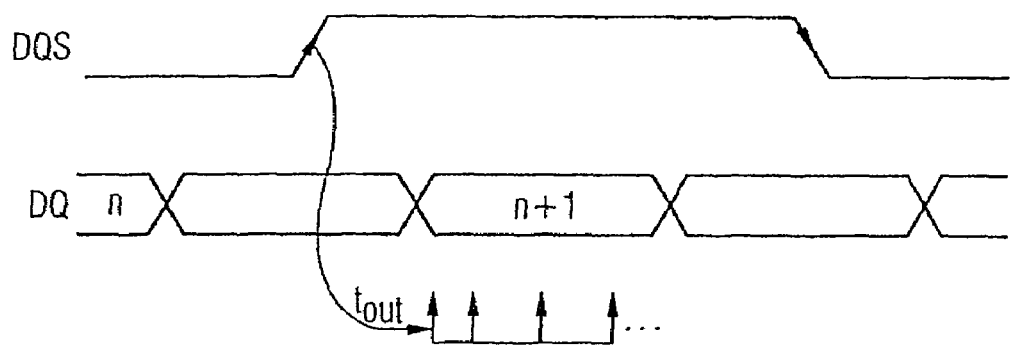
FIG. 4 shows a signal diagram, which shows the profile of output signals in the semiconductor circuit device shown in FIG. 2.

The procedure for reading the test data that is stored in the semiconductor storage device 10 will be described in the following text with reference to FIGS. 2 and 4.

The test data DQ which is stored in the semiconductor storage apparatus 10 is supplied via the data input 32 and the amplification device 40 to the flipflop 48. The data clock DQS which is used for reading data from the semiconductor storage apparatus 10 is supplied via the clock input 34 and the amplification device 42 to the read delay device 50, where the data clock DQS is delayed by a predetermined delay time $\tau_{out}$, and is supplied to the clock input of the flipflop 48.

The adjustable delay time $\tau_{out}$ makes it possible to produce, so to speak, a "snapshot" of the data signal DQ that has been read, at different times. In particular, the data signal DQ that has been read is latched by the flipflop 48 to the data clock signal DQS delayed by the delay time $\tau_{out}$, and is then applied to an input of the comparison device 52. The signal produced in this way is then compared with a suitable reference signal, which has been latched via the data clock input 24 and the flipflop 36. If the comparison result is positive, that is to say the data signal that has been read matches the reference signal, a predetermined output is produced from the comparison device 52 via the input/output connection 26 to the test apparatus 18. If, in contrast, the two signals do not match, an appropriate predetermined signal is emitted. The read delay device 50 can thus be used to latch the data signal DQ, which is received from the semiconductor storage apparatus 10, at different adjustable times.

The signal which is emitted from the comparison device 52 is preferably a binary signal. However, it is also possible for the comparison device 52 to be dispensed with and for the signal which is read from the semiconductor storage apparatus 10 to be tested and is latched via the flipflop 48 to be emitted directly to the test apparatus 18.

The read delay device 50 can thus be used to determine in a simple manner whether a data signal DQ that has been read has a required value at different times.

Figure 5:
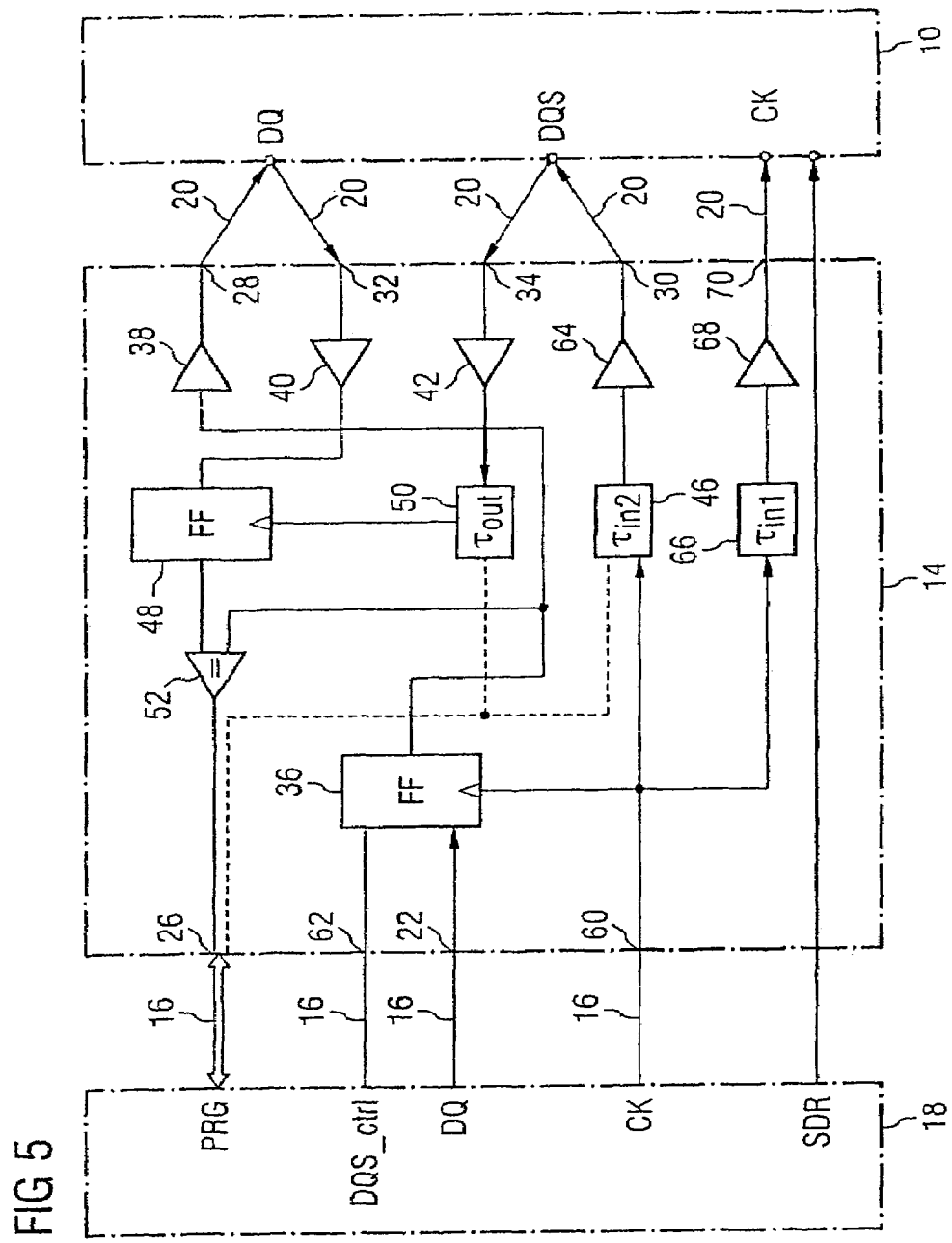
FIG. 5 shows a schematic view of a semiconductor circuit device according to a second preferred embodiment of the present invention.
Figure 6:
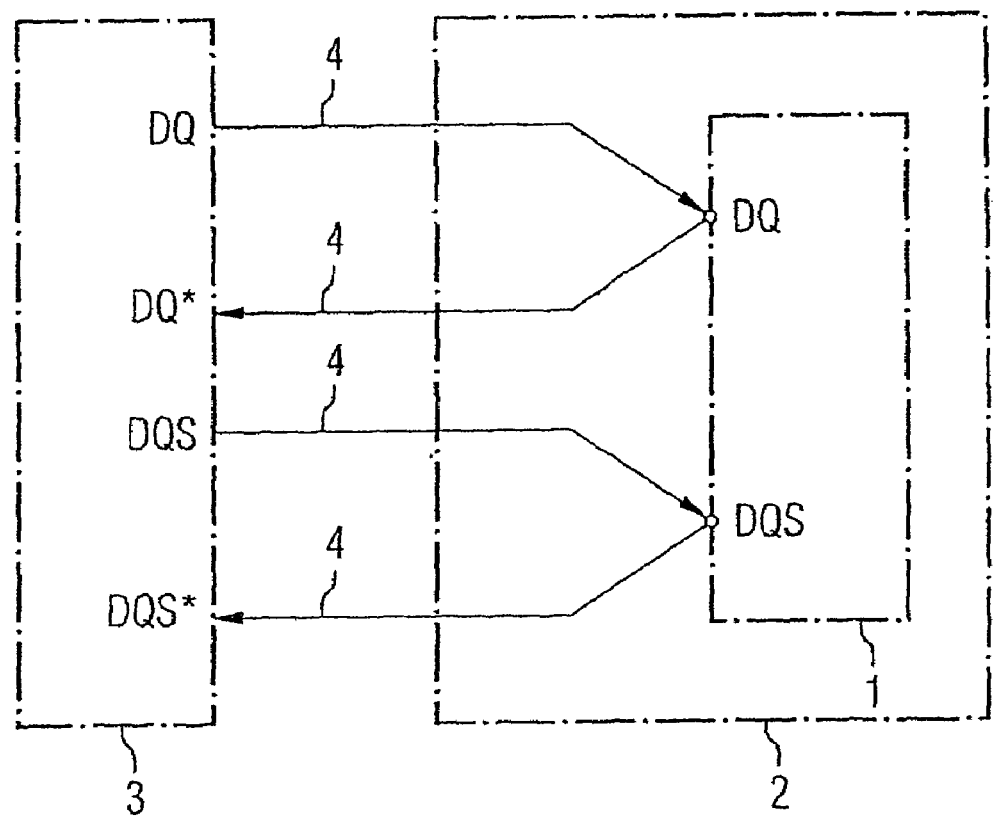
FIG. 6 shows a system for testing a semiconductor storage apparatus according to the prior art.

A second preferred embodiment of a semiconductor circuit device 14 will be described in the following text with reference to FIG. 5. In the following detailed description, those elements of the semiconductor circuit device 14 according to the second embodiment which are identical to the elements of the semiconductor circuit device according to the first embodiment are annotated with the same reference symbols, and they will not be described in detail.

The semiconductor circuit device 14 according to the second embodiment has a test clock input 60 via which a continuously running clock signal can be received from the test apparatus 18. Furthermore, the semiconductor circuit device 14 has a data clock activation input 62, via which a data clock activation (enable) signal, which will be described later, can be received from the test apparatus 18.

The test clock input 60 is connected for signalling purposes to the first write delay device 46 in a similar way to the test data clock input 22 according to the first embodiment. The delay device 46 is connected for signalling purposes via an amplification device 64 to the test data clock output 30. The data clock activation input 62 is likewise connected for signalling purposes via the flipflop 36 to the amplification device 64. The amplification device 64 is designed such that it enables or inhibits an output of the signal that has been delayed by the delay device 46 to the test data clock output 30 as a function of a regulation or control signal DQS_CTRL received via the data clock activation input 62.

The test clock input 60 is also connected for signalling purposes via a second write delay device 66 and an amplification device 68 to a test clock output 70 of the semiconductor circuit device. The second write delay device 66 produces a variable delay of the test clock signal CK by $T_{in1}$.

The operation of the semiconductor circuit device 14 according to the second embodiment of the present invention will be described in the following text.

According to the second embodiment, a continuously running test clock signal CK which is produced by the external test apparatus 18 is used in order to produce a test data clock signal DQS which corresponds at least in places to this test clock signal CK. This test data clock signal DQS differs from the clock signal CK in that it is produced and is present only when it is intended to read or write data signals DQ from or to the semiconductor storage apparatus 10.

The received test clock signal CK is delayed in the first write delay device 46 by a predetermined delay time $\tau_{in2}$, and is supplied to the amplification device 64. In this case, the delay time $\tau_{in2}$ corresponds to the delay time $\tau_{in}$ according to the first embodiment. Depending on whether test data is intended to be read from or writtten to the semiconductor storage apparatus 10, that is to say depending on the data clock activation signal DQS_CTRL, the amplification device 64 amplifies it and does or does not emit a test clock signal, delayed by the delay time $\tau_{in2}$, to the test data clock output 30. In particular, it can be stated that the signal which is applied to the test data clock output 30 corresponds to the test clock signal CK which is received via the test clock input 60 and has been delayed by the delay time $\tau_{in2}$ in the delay device 46, when it is intended to read or write data from or to the semiconductor storage apparatus 10. If, in contrast, no read or write command is present, no test data clock signal is produced at the test data clock output 30.

The method of operation of the first write delay device 46 is the same as in the first embodiment described above.

The received test clock signal CK is also delayed in the second adjustable write delay device 66, and is emitted via the amplification device 68 to the test clock output 70, and is supplied as a continuously running clock signal to the semiconductor storage apparatus CK to be tested. The second adjustable write delay device 66 makes it possible to test whether the semiconductor storage apparatus 10 can or cannot process a predetermined relative time shift of the DQS signal and of the CK signal with respect to one another.

Signals that have been read are emitted in a similar way to that in the first embodiment, and this process will therefore not be described.

In a further embodiment (shown in FIG. 2), it is possible to provide for a test pattern production device 80 to be provided in the semiconductor circuit device 14, in which predetermined test patterns for the test data clock signal can be stored. These stored test patterns can be selected with the aid of a test pattern selection signal produced by a test pattern selector 82. There is thus now no need to transmit the test patterns from the test apparatus 18. In fact, it is sufficient to transmit just one test pattern selection signal to the semiconductor circuit device 14. The test pattern production device is essentially arranged in the signal path upstream of the first flipflop 36. The test data signals produced by the test pattern production device thus occur instead of the test data signals DQ which are transmitted via the test data input 22 in the first and second embodiments. The rest of the operation of the semiconductor circuit device 14 is similar to that of the embodiments described above.

It is also possible to provide for a distribution apparatus to be provided, which is connected to two or more semiconductor circuit devices. In this case, the distribution device receives signals from the test apparatus 18, and transmits them to the large number of semiconductor circuit devices 14. A large number of semiconductor storage apparatuses 10 can thus be tested at the same time using one and the same test signal that is produced by the test apparatus 18. The testing can thus be carried out more quickly, and the number of channels required from the external test apparatus 18 can be reduced further.

Alternatively or in addition to the arrangement of the write delay device 46 according to the first and second embodiments, it is possible to provide for the write delay device 46 to be arranged in the signal path between the flipflop 36 and the amplifier 38 which is connected for signalling purposes to it.

The semiconductor circuit device described above can thus be used to test semiconductor storage apparatuses with very high data rates in a simple and low-cost manner. In particular, there is no need for the accurate time reference between the test data clock and the test data signal to be adjustable in the external test apparatus 18. In fact, the semiconductor circuit device allows appropriate setting in a simple manner. The test signals which are produced by the external test apparatus advantageously have cycles and timings which are sufficiently accurate that data can be identified correctly in the semiconductor circuit device 14. The received test signals are not changed in a logical manner in the semiconductor circuit device. In fact, only the relative time reference of the signals with respect to one another is set to a required value.

The provision of the semiconductor circuit device 14 in the physical proximity of the semiconductor storage device to be tested means that there is no need for calibration or for accurate time matching in the external test apparatus. Furthermore, the number of channels required in the external test apparatus can be reduced.

The received signals are, in particular, regenerated locally and in time in the semiconductor circuit device and are emitted in the original format to the semiconductor storage apparatus. The logical relationship between the signals remains unchanged.

The semiconductor circuit device described above can be used in particular for testing double data rate (DDR) channels for the semiconductor storage apparatus. As illustrated only highly schematically in FIG. 5, single data rate (SDR) channels can be tested in a separate manner.

The relative timing of the test signals with respect to one another can be programmed locally in the semiconductor circuit device 14. In this case, there is no need to consider long running times, owing to the physical proximity of the semiconductor circuit device to the semiconductor storage apparatus to be tested.

In particular no frequency multiplication or production of clock signals takes place in the semiconductor circuit device 14.

The phase relationship between the data clock signal DQS and the clock signal CK of the semiconductor storage apparatus can be varied by the write delay devices 46, 66.

While the foregoing is directed to embodiments of the present invention, other and further embodiments of the invention may be devised without departing from the basic scope thereof, and the scope thereof is determined by the claims that follow.

What is claimed is:

1. A testing circuit for testing a device, comprising:
   a test clock input for receiving a test clock signal from an external test apparatus;
   a test data input for receiving a first test data signal from the external test apparatus; wherein the test clock signal and the test data signal have an initial phase difference upon being received at the test clock input and test data input, respectively;
   a input data storage element connected to the test data input and configured for storing test data represented by the first test data signal; wherein the input data storage element comprises a clock input for receiving the test clock signal and an output for outputting, according to the test clock signal, a second test data signal representative of the test data;
   a test data output connected to the output of the input data storage element and configured for outputting the second test data signal to the device; and
   a test clock output configured to output the test clock signal to the device;
   a first variable delay element configured for adjusting the phase difference between the second test data signal and the test clock signal from the initial phase difference to a first adjusted phase difference between the first test data signal and the test clock signal; wherein the first variable delay element is adjustable, whereby a delay caused by the first variable delay element can be varied according to a controlled input signal.

2. The testing circuit of claim 1, wherein the first variable delay element is provided in one of a first signal path between the test data input and the test data output, and a second signal path between the test clock input and the test clock output.

3. The testing circuit of claim 1, wherein the delay caused by the first variable delay element is varied by the controlled input signal according to a set-up and hold time of the device.

4. The testing circuit of claim 1, further comprising an output data storage element comprising (i) an input for receiving a data result signal representative of data read from the device and (ii) a clock input for receiving a phase adjusted instance of the test clock signal, the phase adjusted instance of the test clock signal having a phase difference, relative to the initial phase, equal to a sum of the first adjusted phase difference and a second adjusted phase difference, the second adjusted phase difference having been introduce later in time than the first adjusted phase difference.

5. The testing circuit of claim 4, further comprising a second variable delay element configured for introducing the second adjusted phase difference; wherein the second variable delay element is adjustable, whereby a respective delay caused by the second variable delay element can be varied according to a respective controlled input signal.

6. The testing circuit of claim 4, further comprising a comparator coupled to the input data storage element and the output data storage element and configured to receive and compare respective outputs from the data storage elements.

7. A method for testing a device, comprising:
   receiving a test clock signal from an external test apparatus;
   receiving a test data signal from the external test apparatus; wherein the test clock signal and the test data signal have an initial phase difference upon being received;

changing the phase difference between the test clock signal and the test data signal from the initial phase difference to a first adjusted phase difference;

outputting the test clock signal and the test data signal, with the adjusted phase difference, to the device;

writing data represented by the test data signal to the device;

reading, from the device, the data previously written to the device, the reading being clocked by the test clock signal having the first adjusted phase difference relative to the test data signal;

comparing the data written to the device to the data read from the device; and adjusting the phase difference between the test clock signal and the test data signal from the first adjusted phase difference phase difference to a second adjusted phase difference.

8. The method of claim 7, wherein the test data signal received from the external test apparatus is input to an input data storage element that is strobed by the test clock signal received from external test apparatus, wherein the input data storage element being strobed causes the writing of the data to the device.

9. The method of claim 7, wherein adjusting the phase difference is done in an effort to achieve a desired set-up and hold time of the device.

10. The method of claim 7, wherein adjusting the phase difference between the test clock signal and the test data signal from the first adjusted phase difference phase difference to the second adjusted phase difference is done dependent on an outcome of the comparing.

11. The method of claim 7, wherein changing the phase difference comprises propagating the test clock signal through a delay element.

12. The method of claim 11, wherein adjusting the phase difference comprises changing a length of a delay caused by the delay element.

13. The method of claim 12, wherein changing the length of the delay is done by issuing a control signal to the delay element.

14. The method of claim 7, further comprising:

storing the data read from the device in an output data storage element; and strobing the output data storage element with an output clock signal having a third adjusted phase difference relative to the test clock signal received from the external test apparatus, the third adjusted phase difference being based an additional phase adjustment to the first adjusted phase difference.

15. The method of claim 14, further comprising:

receiving a device clock signal from the device, the device clock signal corresponding to the test clock signal with the first adjusted phase difference; and delaying the received device clock signal for a delay period, the resulting delayed clock signal being the output clock signal which is then used to strobe the output data storage element.

16. A testing circuit for testing a device, comprising:

a test clock input for receiving a test clock signal from an external test apparatus;

a test data input for receiving a first test data signal from the external test apparatus, the first test data signal being representative of test data; wherein the test clock signal and the test data signal have an initial phase difference upon being received at the test clock input and test data input, respectively;

a first delay element configured to delay the test clock signal by a first delay period and output a first delayed test clock signal, wherein the first delay element comprises an input for a first control signal to vary the first delay period;

a test data output configured for outputting the test data to the device; and a test clock output configured to output the delayed test clock signal to the device; and a comparator comprising an first input for the test data received from the external test apparatus and a second input for result data read from the device;

wherein the comparator is configured to compare the received test data and the result data and produce a predefined output if the data match.

17. The testing circuit of claim 16, further comprising a test pattern generator and a test pattern selector, the test pattern selector configured to assert a signal for causing the test pattern generator to generate a predefined test data pattern.

18. The testing circuit of claim 16, further comprising an enable signal input for receiving an ENABLE signal whereby the delayed test clock signal may be selectively output to the device.

19. The testing circuit of claim 16, further comprising:

the external test apparatus connected to the test data input; and the device connected to the test data output.

20. The testing circuit of claim 16, further comprising an input data storage element taking as input the test data signal and the test clock signal, whereby the input data storage element is strobed by the test clock signal causing the output of the test data to the device.

21. The testing circuit of claim 16, further comprising a second delay element configured to receive the delay test clock signal from the device and further configured to delay the delay test clock signal by a second delay period and output a second delayed test clock signal.

22. The testing circuit of claim 21, wherein the second delay element comprises an input for a second control signal to vary the second delay period.

23. The testing circuit of claim 21, further comprising:

an input data storage element taking as input the test data signal and the test clock signal, whereby the input data storage element is strobed by the test clock signal causing the output of the test data to the device; and an output data storage element taking as input the result data read from the device and the second delayed test clock signal, whereby the output data storage element is strobed by the second delayed test clock signal causing the output of the result data to the device.

* * * * *